(12) United States Patent
Hu et al.

(10) Patent No.: US 10,916,615 B1
(45) Date of Patent: Feb. 9, 2021

(54) DISPLAY DEVICE, DISPLAY PANEL AND MANUFACTURING METHOD THEREOF

(71) Applicants: Hefei Xinsheng Optoelectronics Technology Co., Ltd., Hefei (CN); BOE TECHNOLOGY GROUP CO., LTD., Beijing (CN)

(72) Inventors: Yingbin Hu, Beijing (CN); Ce Zhao, Beijing (CN); Ming Wang, Beijing (CN); Yuankui Ding, Beijing (CN); Wei Song, Beijing (CN); Liangchen Yan, Beijing (CN)

(73) Assignees: Hefei Xinsheng Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/826,992

(22) Filed: Mar. 23, 2020

(30) Foreign Application Priority Data

Nov. 22, 2019 (CN) .......................... 2019 1 1153855

(51) Int. Cl.
*H01L 27/32* (2006.01)
*H01L 51/52* (2006.01)
*H01L 51/56* (2006.01)

(52) U.S. Cl.
CPC ...... *H01L 27/3272* (2013.01); *H01L 51/5253* (2013.01); *H01L 51/56* (2013.01)

(58) Field of Classification Search
CPC .. H01L 51/5253; H01L 27/3272; H01L 51/56
USPC .......................................................... 257/40
See application file for complete search history.

(56) References Cited

U.S. PATENT DOCUMENTS

2019/0019966 A1* 1/2019 Jiang ................... H01L 27/3276

* cited by examiner

*Primary Examiner* — Elias Ullah
(74) *Attorney, Agent, or Firm* — Thomas|Horstemeyer, LLP

(57) ABSTRACT

A display panel includes a substrate; a conductive layer disposed on the substrate; a gate insulating layer disposed on the conductive layer; a gate layer disposed on the gate insulating layer, wherein the gate layer has a thickness larger than a thickness of the conductive layer; a groove extending toward the substrate and punching through the gate layer, orthographic projections of the groove and the conductive layer on the substrate overlapping, and gate layers separated on two sides of the groove being connected to the conductive layer; an interlayer dielectric layer disposed on a side of the gate layer away from the substrate and covering the conductive layer and filling the groove; and an auxiliary electrode layer disposed on the interlayer dielectric layer, wherein the orthographic projections of the auxiliary electrode layer and the gate layer on substrate do not overlap, and the orthographic projections of the auxiliary electrode layer and the groove on the substrate overlap.

14 Claims, 2 Drawing Sheets

DISPLAY DEVICE, DISPLAY PANEL AND MANUFACTURING METHOD THEREOF

CROSS-REFERENCE TO RELATED APPLICATIONS

The present application claims the benefit of and priority to Chinese Patent Application No. 201911153855.7 and filed Nov. 22, 2019, the entire contents of which are incorporated herein by reference.

TECHNICAL FIELD

The present disclosure relates to the technical field of display technology and, in particular, to a display panel, a manufacturing method thereof, and a display device.

BACKGROUND

Organic Light Emitting Diode (OLED) display panels have many advantages, such as thin size, light weight, wide viewing angle, active light emission, continuously adjustable light color, fast response speed, low energy consumption, simple production process, high light emission efficiency, flexible display, and the like, and have been listed as the next-generation display technology with great development prospects. As such, OLED display panels are widely used in various electronic products.

Currently, OLED display panels are classified into top emission and bottom emission structures. In top emission structures, the light emitted by the OLED display panel is transmitted from the direction of the cathode. Therefore, the cathode of the top emission OLED panel needs to be made of a transparent conductive material. However, since the material per se has a certain resistance value, when the size of the OLED panel is large, the resistance of the OLED cathode material per se will cause a voltage drop, which will cause decrease in the display brightness of the panel.

It should be noted that the information disclosed in the background section above is only used to enhance the understanding of the background of the present disclosure and, therefore, may include information that does not constitute the prior art known to those of ordinary skill in the art.

SUMMARY

According to an aspect of the present disclosure, a display panel is provided. The display panel includes: a substrate; a conductive layer disposed on a side of the substrate; a gate insulating layer disposed on a side of the conductive layer away from the substrate; a gate layer disposed on a side of the gate insulating layer away from the substrate, where the gate layer has a thickness larger than a thickness of the conductive layer; a groove extending toward the substrate and punching through the gate layer that is formed in the gate layer, where an orthographic projection of the groove on the substrate overlaps with an orthographic projection of the groove the conductive layer on the substrate, and gate layers separated on two sides of the groove are connected to the conductive layer by respectively penetrating the gate insulating layer; an interlayer dielectric layer disposed on a side of the gate layer away from the substrate, the interlayer dielectric layer covering the conductive layer and filling the groove; and an auxiliary electrode layer disposed on a side of the interlayer dielectric layer away from the substrate, where the orthographic projection of the auxiliary electrode layer on substrate does not overlap with the orthographic projection of the gate layer on the substrate, and the orthographic projection of the auxiliary electrode layer on the substrate overlaps with the orthographic projections of the groove on the substrate.

In an exemplary embodiment of the present disclosure, the conductive layer is a light-shielding conductive material.

In an exemplary embodiment of the present disclosure, the display panel further includes: a passivation layer disposed on a side of the interlayer dielectric layer away from the substrate and covering the conductive layer; a planar layer disposed on a side of the passivation layer away from the substrate; and a via hole being disposed on the passivation layer and the planar layer to communicate with the auxiliary electrode layer.

In an exemplary embodiment of the present disclosure, the display panel further includes: a buffer layer disposed between the substrate and the gate insulating layer and covering the conductive layer, where the groove penetrates the gate insulating layer and communicates with the buffer layer.

In an exemplary embodiment of the present disclosure, the conductive layer has a thickness of 0.1 µm to 0.2 µm.

According to another aspect of the present disclosure, a manufacturing method for a display panel is provided. The manufacturing method includes: providing a substrate; forming a conductive layer on a side of the substrate; forming a gate insulating layer on a side of the conductive layer away from the substrate; forming a gate layer on a side of the gate insulating layer away from the substrate, and making the thickness of the gate layer larger than the thickness of the conductive layer; forming a groove extending toward the substrate and punching through the gate layer in the gate layer, where an orthographic projection of the groove on the substrate overlaps with an orthographic projection of the conductive layer on the substrate, and gate layers separated on two sides of the groove are connected to the conductive layer by respectively penetrating the gate insulating layer; forming an interlayer dielectric layer on a side of the gate layer away from the substrate, the interlayer dielectric layer covering the conductive layer and filling the groove; and forming an auxiliary electrode layer on a side of the interlayer dielectric layer away from the substrate, where the orthographic projection of the auxiliary electrode layer on substrate does not overlap with the orthographic projection of the gate layer on the substrate, and the orthographic projection of the auxiliary electrode layer on the substrate overlaps with the orthographic projections of the groove on the substrate.

In an exemplary embodiment of the present disclosure, after the conductive layer is formed on a side of the substrate, before the gate insulating layer is formed on a side of the conductive layer away from the substrate, the manufacturing method further includes forming a buffer layer covering the conductive layer on a side of the substrate on which the conductive layer is disposed.

In an exemplary embodiment of the present disclosure, forming a groove extending toward the substrate and punching through the gate layer in the gate layer includes forming a groove extending toward the substrate and punching through the gate layer on the gate layer, and making the groove penetrate the gate insulation layer and communicate with the buffer layer.

In an exemplary embodiment of the present disclosure, the manufacturing method further includes forming a passivation layer covering the conductive layer on a side of the interlayer dielectric layer away from the substrate; forming a planar layer on a side of the passivation layer away from the substrate; and forming a via hole communicating with the auxiliary electrode layer on the passivation layer and the planar layer.

According to yet another aspect of the present disclosure, a display device is provided. The display device includes the display panel described above.

It should be understood that both the foregoing general description and the following detailed description are exemplary and explanatory only and are not restrictive of the disclosure.

BRIEF DESCRIPTION OF THE DRAWINGS

The drawings herein are incorporated in and constitute a part of this specification, illustrate embodiments consistent with the present disclosure, and together with the description, serve to explain the principles of the present disclosure. Understandably, the drawings in the following description are just some embodiments of the present disclosure. For those of ordinary skill in the art, other drawings can be obtained based on these drawings without creative effort.

DETAILED DESCRIPTION

Figure 1:
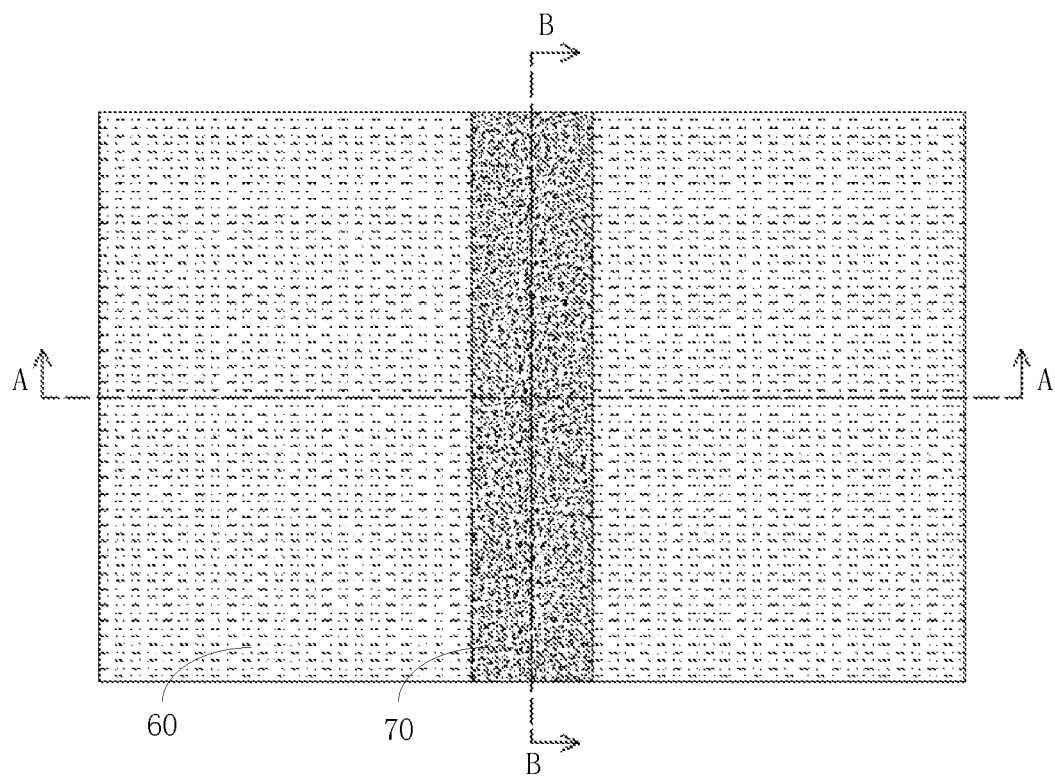
FIG. 1 is a top view of a display panel according to an embodiment of the present disclosure.

Exemplary embodiments will now be described more fully with reference to the accompanying drawings. However, the exemplary embodiments can be implemented in various forms and should not be construed as limited to the examples set forth herein; rather, the embodiments are provided so that the present disclosure will be more comprehensive and complete, and the concepts of the exemplary embodiments will be fully conveyed to those skilled in the art. The described features, structures, or characteristics may be combined in any suitable manner in one or more embodiments. In the following description, numerous specific details are provided to give a thorough understanding of the embodiments of the present disclosure. However, those skilled in the art will realize that the technical solutions of the present disclosure may be practiced without omitting one or more of the specific details, or other methods, steps, etc. may be adopted. In other cases, well-known technical solutions are not shown or described in detail to avoid obscuring aspects of the present disclosure.

In addition, the drawings are merely schematic illustrations of the present disclosure and are not necessarily drawn to scale. The same reference numerals in the drawings represent the same or similar parts, and thus repeated descriptions thereof will be omitted. The terms "a", "an", "the", and "said" are used to indicate the presence of one or more elements, components, and the like. The terms "including" and "having" are used to include open-ended inclusive meaning and means that there may be additional elements, components, and the like in addition to the listed elements, components, and the like.

In the related art, an auxiliary cathode is conventionally used to reduce the resistance value of the cathode. The auxiliary cathode wiring is completed at a source-drain wiring layer of the thin film transistor. Conventionally, a passivation layer and a planar layer are disposed on the source-drain wiring layer. The passivation layer and the planar layer have to be etched with a hole to implement overlapping and connecting of the auxiliary cathode wiring. However, the position of the auxiliary cathode hole is above and adjacent to the gate wiring, resulting in different thicknesses for the planar layer in the hole.

For an 8K top-emission printed OLED product, the auxiliary cathode array process is applied and the auxiliary cathode wiring is completed on the source-drain wiring layer of the thin film transistor. Generally, a passivation layer and a planar layer are disposed above the source-drain wiring layer, where the passivation layer and the planar layer have to be etched to implement overlapping and connecting of the auxiliary cathode wiring. The position of the auxiliary cathode hole is above and adjacent to the gate wiring, resulting in different thicknesses for the planar layer in the hole. The difference in the thicknesses of the planar layer is the total film thickness of the gate wiring layer and the gate insulating layer, which is about 1 μm. This will cause excessive over-etching above the gate electrode during a dry etching process, and cause over-etching on the auxiliary cathode wiring. If the auxiliary cathode wiring is formed of a copper process, the auxiliary cathode wiring tends to generate oxidation. Also, if the auxiliary cathode wiring is formed of an aluminum process, the auxiliary cathode wiring tends to be broken when being etched. Further, in an area where the gate wiring and the auxiliary cathode wiring overlap, the gate wiring and the data line tend to have short-circuit type of defects (Data Gate Short).

Figure 2:
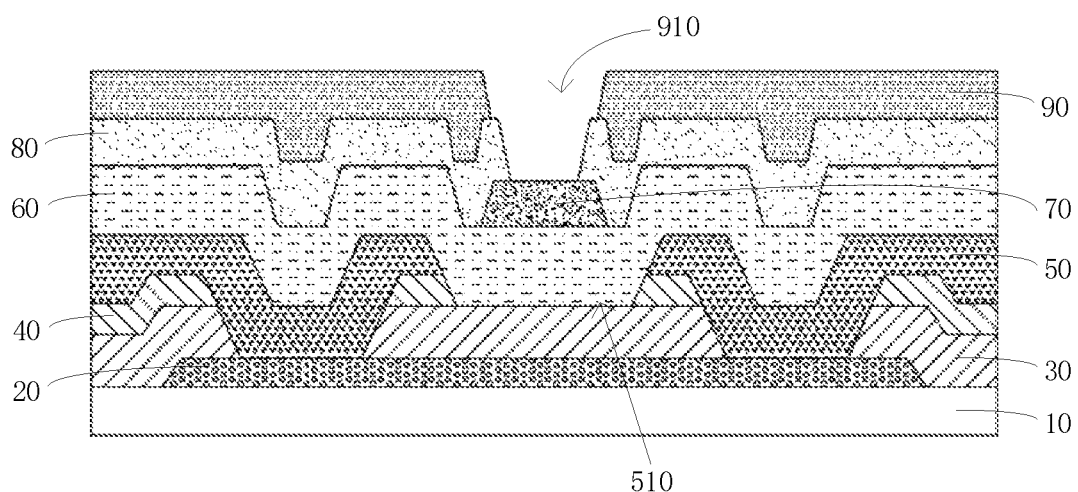
FIG. 2 is a cross-sectional view of the A-A plane in FIG. 1.
Figure 3:
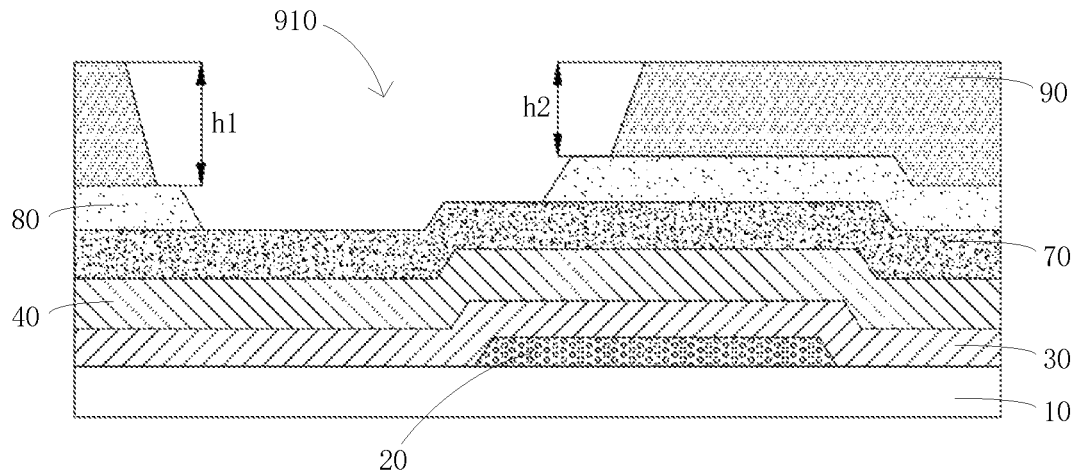
FIG. 3 is a cross-sectional view of the B-B plane in FIG. 1.

First, in an exemplary embodiment of the present disclosure, a display panel is provided, as shown in FIGS. 1-3. The display panel includes a substrate 10, a conductive layer 20, a gate insulating layer 40, a gate layer 50, an interlayer dielectric layer 60, and an auxiliary electrode layer 70. The conductive layer 20 is disposed on a side of the substrate 10 and the gate insulating layer 40 is disposed on the side of the conductive layer 20 away from the substrate 10. The gate layer 50 is disposed on the side of the gate insulating layer 40 away from the substrate 10, and has a thickness larger than that of the conductive layer 20. A groove 510 extending toward the substrate 10 is formed in the gate layer 50. The gate layer 50 is punched by the groove 510 and divided into a plurality of disconnected portions. That is, the disconnected gate layers 50 are separated from each other by the groove 510. The groove 510 is opposite to and aligned with the conductive layer, that is, an orthographic projection of the groove 510 is located on the conductive layer 20, and the gate lines disconnected on two sides of the groove 510 are connected to the conductive layer 20 through the gate insulating layer 40, respectively. The interlayer dielectric layer 6 is disposed on the side of the gate layer 50 away from the substrate 10, covering the conductive layer 20 and filling the grooves 510. The auxiliary electrode layer 70 is disposed on the side of the interlayer dielectric layer 60 away from the substrate 10. The orthographic projection of the auxiliary electrode layer 70 on substrate 10 does not overlap with the orthographic projection of the gate layer 50 on the substrate 10. The orthographic projection of the auxiliary electrode layer 70 on the substrate overlaps with the orthographic projections of the groove 510 on the substrate. The orthographic projection of the auxiliary electrode layer is within the groove 510. That is, orthographic projections of the gate layer and the auxiliary electrode layer are completely misaligned on the substrate 10.

In the display panel provided by the present disclosure, the gate layer is divided into a plurality of disconnected portions by the groove, and the orthographic projection of the auxiliary electrode layer on substrate does not overlap with the orthographic projection of the gate layer on the substrate. The two ends of the gate layer that are disconnected are electrically connected through the conductive layer 20 respectively. Since the gate layer is disconnected, no gate layer is disposed underneath the corresponding auxiliary electrode line. Since the thicknesses of the conductive layer 20 and the gate insulating layer 40 are small, the height of the portion where the auxiliary electrode layer intersects with the extension direction of the gate layer can be reduced with respect to the height of the substrate 10, thereby allowing reducing difference in heights of various portions of the auxiliary electrode layer. Further, when the planar layer 90 is formed on the gate layer 50, the problem of uneven thickness of the planar layer 90 caused by the auxiliary electrode layers can be effectively reduced such that, when a via hole 910 for overlapping and connecting the auxiliary cathode wiring is formed by etching on the planar layer 90, it can effectively avoid the phenomenon of defective etching on the auxiliary electrode layer 70.

In addition, between the auxiliary electrode layer and the conductive layer 20, there are two insulating layers, i.e., the gate insulating layer 40 and the interlayer dielectric layer 60, which can reduce the risk of a short circuit between the auxiliary electrode layer and the conductive layer 20, that is, basically solve the DGS risk here.

The material of the substrate 10 may be an inorganic material, such as a glass material, such as soda lime glass, quartz glass, sapphire glass, or a metal material of various metals, such as stainless steel, aluminum, nickel, or an alloy thereof. Alternatively, the material of the substrate 10 may be an organic material, such as polymethyl methacrylate, polyvinyl alcohol, polyvinyl phenol, polyethersulfone, polyimide, polyamide, polyacetal, polycarbonate, or a combination thereof. The material of the gate insulating layer 40 may be silicon oxide, silicon oxynitride, silicon nitride, or other suitable insulating materials (such as organic polymer compounds), or a combination of these materials. The material of the gate layer 50 may be a metal, a conductive metal oxide, a conductive polymer, a conductive composite material, or a combination thereof. For example, the metal can be platinum, gold, silver, aluminum, chromium, nickel, titanium, magnesium, iron, manganese, or a combination thereof. The conductive metal oxide can be indium tin oxide (ITO), fluorine-doped tin oxide (FTO), aluminum-doped zinc oxide (AZO), gallium-doped zinc oxide (GZO), or a combination thereof. The material of the interlayer dielectric layer 60 may be silicon oxide, silicon oxynitride, silicon nitride, or other suitable insulating substances (such as an organic polymer compound) or a combination of the above materials. The auxiliary electrode layer 70 includes a plurality of auxiliary electrode lines, and each auxiliary electrode line communicates with a plurality of auxiliary electrodes. The auxiliary electrode line may be an auxiliary cathode line or an auxiliary anode line. The auxiliary electrode layer 70 may further include source-drain wiring. The material of the auxiliary electrode layer 70 may be a metal, a conductive oxide, or a combination thereof. For example, the metal may be titanium, platinum, gold, silver, aluminum, tungsten, copper, or a combination thereof. An alloy or a combination of the foregoing materials, and the conductive oxide may be IZO, AZO, ITO, GZO, ZTO, or a combination thereof. The present disclosure only provides examples of the materials of the above-mentioned layers, and does not limit the materials of the above-mentioned layers. However, those skilled in the art may also select materials other than the materials listed above to form the above-mentioned layers, and the present disclosure does not limit this.

Specifically, the conductive layer 20 is a light-shielding conductive material, that is, the conductive layer 20 can also serve as a light-shielding layer. The material of the conductive layer 20 may be at least one of copper, aluminum, molybdenum, titanium, chromium, and tungsten.

Specifically, as shown in FIG. 2, the display panel further includes a buffer layer 30 that is disposed between the substrate 10 and the gate insulating layer 40, and covers the conductive layer 20. The sum of the thicknesses of the buffer layer 30 and the interlayer dielectric layer 60 between the auxiliary electrode layer and the conductive layer 20 is 1 μm to 1.5 μm, so that there are two insulating layers, i.e. the interlayer dielectric layer 60 and the buffer layer 30, between the auxiliary electrode layer and the conductive layer 20. The insulating layer can reduce the risk of a short circuit between the auxiliary electrode layer and the conductive layer 20, that is, the risk of DGS here is basically solved. The material of the buffer layer 30 may be an insulating material, such as silicon oxide or silicon nitride, which is not limited in the present disclosure.

Specifically, the groove 510 extends into the gate insulating layer 40 toward the substrate 10, which can further reduce the height at the corresponding position of the auxiliary electrode layer and the groove 510 relative to the substrate 10 so as to make the thickness of the planar layer 90 on the auxiliary electrode layer more uniform, thereby further effectively avoiding the phenomenon of defective etching on the auxiliary electrode layer 70.

Further, the groove 510 penetrates the gate insulating layer 40. When the buffer layer 30 is disposed on the substrate 10, the groove 510 communicates with the buffer layer 30. The groove 510 penetrating the gate insulating layer 40 can further reduce the height at the corresponding position of the auxiliary electrode layer and the groove 510 relative to the substrate 10. The difference in thickness h1−h2 of the planar layer 90 due to the auxiliary electrode layer is equal to the thickness of the conductive layer 20. The thickness of the conductive layer 20 is 0.1 μm-0.2 μm. It can be seen that the thickness difference of the planar layer 90 can be reduced by an order of magnitude by the setting of the present disclosure, which can greatly improve the thickness uniformity of the planar layer 90, more effectively reduce the phenomenon of defective etching on the auxiliary electrode layer 70, and ensure the reliability of the display panel.

Specifically, the passivation layer 80 and the planar layer 90 are not shown in FIG. 1. As shown in FIG. 2, however, the display panel further includes a passivation layer 80 and a planar layer 90. The passivation layer 80 is disposed on a side of the interlayer dielectric layer 60 away from the substrate 10 and covers the conductive layer 50. The planar layer 90 is disposed on a side of the passivation layer 80 away from the substrate 10, and a via hole 910 is formed on the passivation layer 80 and the planar layer 90 to communicate with the auxiliary electrode layer. The materials of the passivation layer 80 may be silicon oxide, silicon oxynitride, silicon nitride, organic materials, or a combination thereof. The material of the planarization layer may be any one of butadiene rubber, polyurethane, polyvinyl chloride, and polyamide or any one of polycarbonate, polyimide, polyether alum resin, and epoxy resin, which is not limited in the present disclosure.

In the present disclosure, by dividing the gate layer into a plurality of disconnected portions so that the orthographic projection of the auxiliary electrode layer on substrate does not overlap with the orthographic projection of the gate layer on the substrate, and conducting the disconnected portions through the conductive layer 20, the height difference between the auxiliary electrode layer and the substrate 10 can be reduced, and the thickness of the planar layer 90 can be made more uniform. The difference in thickness between different locations is reduced, thereby avoiding the phenomenon of defective etching of the auxiliary electrode layer 70 when the via layer 910 is formed in the planar layer 90.

The following is an embodiment of the method of the present disclosure and can be used to manufacture the apparatus of the embodiment of the present disclosure. For details not disclosed in the method embodiment of the present disclosure, reference can be made to the apparatus embodiment of the present disclosure.

Figure 4:
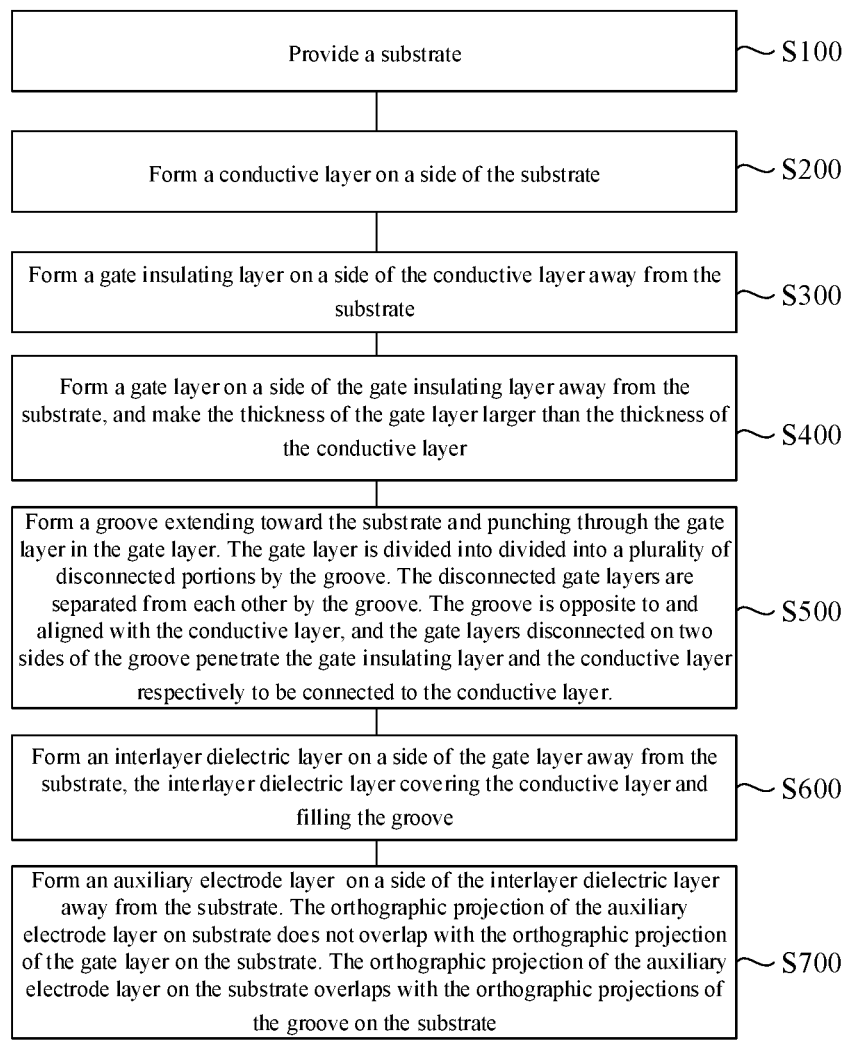
FIG. 4 is a flowchart of a manufacturing method for a display panel according to an embodiment of the present disclosure.

This exemplary embodiment provides a manufacturing method for a display panel or, in other words, a method of manufacturing a display panel. As shown in FIG. 4, the method includes the following steps.

At step S100, a substrate is provided.

At step S200, a conductive layer is formed on a side of the substrate.

At step S300, a gate insulating layer is formed on a side of the conductive layer away from the substrate.

At step S400, a gate layer is formed on a side of the gate insulating layer away from the substrate, the gate layer has a thickness larger than the thickness of the conductive layer.

At step S500, a groove extending toward the substrate and punching through the gate layer is formed in the gate layer. The gate layer is divided into divided into a plurality of disconnected portions by the groove. The disconnected gate layers are separated from each other by the groove. The groove is opposite to and aligned with the conductive layer, and the gate layers disconnected on two sides of the groove penetrate the gate insulating layer and the conductive layer respectively to be connected to the conductive layer.

At step S600, an interlayer dielectric layer is formed on a side of the gate layer away from the substrate, the interlayer dielectric layer covering the conductive layer and filling the groove.

At step S700, an auxiliary electrode layer is formed on a side of the interlayer dielectric layer away from the substrate. The orthographic projection of the auxiliary electrode layer on substrate does not overlap with the orthographic projection of the gate layer on the substrate. The orthographic projection of the auxiliary electrode layer on the substrate overlaps with the orthographic projections of the groove on the substrate.

In the manufacturing method of a display panel provided by the present disclosure, the gate layer is divided into a plurality of disconnected portions by the groove, and two ends of the gate layer that are disconnected are electrically connected through the conductive layer, respectively. After the gate layer is disconnected, no gate layer is disposed underneath the corresponding auxiliary electrode line. Since the thicknesses of the conductive layer and the gate insulating layer are small, the height of the portion where the auxiliary electrode layer intersects with the extension direction of the gate layer can be reduced with respect to the height of the substrate, thereby allowing reducing difference in heights of various portions of the auxiliary electrode layer. Further, when the planar layer is formed on the gate layer, the problem of uneven thickness of the planar layer caused by the auxiliary electrode layers can be effectively reduced, so that when a via hole for overlapping and connecting the auxiliary cathode wiring is formed by etching on the planar layer, which can effectively avoid the phenomenon of defective etching on the auxiliary electrode layer.

In addition, there are two insulating layers between the gate electrode layer and the interlayer dielectric layer between the auxiliary electrode layer and the conductive layer, which can reduce the risk of a short circuit between the auxiliary electrode layer and the conductive layer, which basically solves the DGS risk here.

Hereinafter, each step of the manufacturing method for a display panel in this exemplary embodiment will be further described.

At step S100, a substrate is provided.

Specifically, as shown in FIG. 2, the material of the substrate 10 may be an inorganic material, such as a glass material such as soda lime glass, quartz glass, sapphire glass, or a metal material of various metals such as stainless steel, aluminum, nickel, or alloys thereof. It may also be an organic material, such as polymethyl methacrylate, polyvinyl alcohol, polyvinyl phenol, polyethersulfone, polyimide, polyamide, polyacetal, polycarbonate, or a combination thereof.

At step S200, a conductive layer is formed on a side of the substrate.

Specifically, as shown in FIG. 2, a process such as a physical vapor deposition (PVD) method, a chemical vapor deposition (CVD) method, a spin coating method, or a combination thereof may be used on one side of the substrate 10 to form a conductive layer 20, and the conductive layer 20 can also serve as a light shielding layer. The material of the conductive layer 20 is at least one of copper, aluminum, molybdenum, titanium, chromium, and tungsten. In addition, the conductive layer 20 may be a single-layer metal structure or a multilayer metal structure, such as a multilayer metal of molybdenum, aluminum, molybdenum, a multilayer metal of titanium, copper, titanium, or a multilayer metal of molybdenum, titanium, or copper. The conductive layer 20 has a thickness of 0.1 μm to 0.2 μm, for example, 0.1 μm, 0.13 μm, 0.15 μm, 0.17 μm, or 0.2 μm, which are not listed one by one herein, and the conductive layer 20 may also has a thickness larger than 0.2 μm, and may also be less than 0.1 μm, which is not limited in the present disclosure.

At step S300, a gate insulating layer is formed on a side of the conductive layer away from the substrate.

Specifically, as shown in FIG. 2, before the gate insulating layer 40 is formed, a buffer layer 3 is formed on the substrate 10 to cover the substrate 10 and the conductive layer 20 by a process such as a physical vapor deposition method, a chemical vapor deposition method, a spin coating method, or a combination thereof. The material of the buffer layer 30 may be an insulating material such as silicon oxide or silicon nitride, which is not limited in the present disclosure. Then, a gate insulating layer 40 is formed on a side of the buffer layer 30 away from the substrate 10 by a physical vapor deposition method, a chemical vapor deposition method, a spin coating method, or a combination thereof. The material of the gate insulating layer 40 may be silicon oxide, silicon oxynitride, silicon nitride, or other suitable insulating materials (such as organic polymer compounds) or a combination of these materials.

In addition, before the gate layer 50 is formed, via holes are respectively formed on the gate insulating layers 40 on two sides of the groove 510 at predetermined positions by etching, and then the gate layer 50 is formed to connected to the conductive layer 20 through the via holes on the gate insulating layer 40 on the two sides of the groove 510. When the buffer layer 30 is further provided, a via hole is penetrated through both of the buffer layer 30 and the gate insulating layer 40 to expose the conductive layer 20.

At step S400, a gate layer is formed on a side of the gate insulating layer away from the substrate, the gate layer has a thickness larger than the thickness of the conductive layer, and the gate layer includes a plurality of gate lines.

Specifically, as shown in FIG. 2, a gate layer 50 is formed on a side of the gate insulating layer 40 away from the substrate 10 by a process such as a physical vapor deposition method, a chemical vapor deposition method, a spin coating method, or a combination thereof. The gate layer 50 has a thickness larger than that of the conductive layer 20, that is, the thickness of the gate layer 50 is larger than 0.2 μm. The gate layer 50 forms a plurality of gate lines through a process such as patterning, and the gate layers are connected to the conductive layer 20 through the gate insulating layer 40 or the via holes on the gate insulating layer 40 and the buffer layer 30. The material of the gate layer 50 may be a metal, a conductive metal oxide, a conductive polymer, or a conductive composite material or a combination thereof. For example, the metal may be platinum, gold, silver, aluminum, nickel, copper, molybdenum, titanium, magnesium, calcium, barium, sodium, iron, manganese, or a combination thereof. The conductive metal oxide may be indium tin oxide (ITO), fluorine-doped tin oxide (FTO), aluminum-doped zinc oxide (AZO), gallium-doped zinc oxide (GZO), or a combination thereof, which will not be limited in the present disclosure.

At step S500, a groove extending toward the substrate and punching through the gate layer is formed in the gate layer. The gate layer is divided into divided into a plurality of disconnected portions by the groove. The disconnected gate layers are separated from each other by the groove extending toward the substrate. The groove is opposite to and aligned with the conductive layer, and the gate layers disconnected on two sides of the groove penetrate the gate insulating layer and the conductive layer, respectively, to be connected to the conductive layer.

Specifically, as shown in FIG. 2, a portion where the gate layer 50 intersects a predetermined position of the auxiliary electrode layer is etched to form a groove 510 that cuts off the gate layer, and the groove 510 is opposite to and aligned with the conductive layer 20, such that the predetermined position of the auxiliary electrode layer is completely misaligned with the orthographic projection of the gate layer on the substrate 10. The gate layers disconnected on two sides of the groove 510 are respectively connected to the conductive layer 20 through the via holes.

At step S600, an interlayer dielectric layer is formed on a side of the gate layer away from the substrate, the interlayer dielectric layer covering the conductive layer and filling the groove.

Specifically, as shown in FIG. 2, an interlayer dielectric layer 60 is formed on a side of the gate layer 50 away from the substrate 10 through a physical vapor deposition method, a chemical vapor deposition method, a spin coating method, or a combination thereof, and the like. The interlayer dielectric layer 60 covers the gate layer 50 and fills the groove 510. The material of the interlayer dielectric layer 60 may be silicon oxide, silicon oxynitride, silicon nitride, or other suitable insulating materials (such as organic polymer compounds), or a combination of the foregoing materials.

At step S700, an auxiliary electrode layer is formed on a side of the interlayer dielectric layer away from the substrate. The orthographic projection of the auxiliary electrode layer on substrate does not overlap with the orthographic projection of the gate layer on the substrate. The orthographic projection of the auxiliary electrode layer on the substrate overlaps with the orthographic projections of the groove on the substrate. The orthographic projection of the auxiliary electrode layer is within the groove. That is, orthographic projections of the gate layer and the auxiliary electrode layer are completely misaligned on the substrate.

Specifically, as shown in FIG. 2, an auxiliary electrode layer 70 may be formed on a side of the interlayer dielectric layer 60 away from the substrate 10 by a process such as physical vapor deposition, chemical vapor deposition, spin coating, or a combination thereof. The auxiliary electrode layer 70 forms a plurality of auxiliary electrode lines through a patterning process; the orthographic projection of the auxiliary electrode layers on the gate layer 50 intersects with the gate layers in the groove 510, and the orthographic projection of the intersecting portion on the gate layer 50 is completely located in the groove 510. The material of the auxiliary electrode layer 70 may be a metal, a conductive oxide, or a combination thereof. For example, the metal may be titanium, platinum, gold, silver, aluminum, tungsten, copper, or an alloy thereof, or a combination thereof, and the conductive oxide may be IZO, AZO, ITO, GZO, ZTO, or a combination thereof.

In addition, as shown in FIG. 2 and FIG. 3, the manufacturing method for the display panel provided by the present disclosure may further include a step: a passivation layer 80 covering the conductive layer 60 may be formed a side of the interlayer dielectric layer 70 by a process such as a physical vapor deposition method, a chemical vapor deposition method, a spin coating method, or a combination thereof. A planar layer 90 is formed on a side of the passivation layer 80 away from the substrate 10 by a physical vapor deposition method, a chemical vapor deposition method, a spin coating method, or a combination thereof. A via hole 910 is formed on the passivation layer 80 and the planar layer 90 to communicate with the auxiliary electrode layer through a process such as etching, so as to implement the overlapping and connecting of the auxiliary cathode.

The material of the passivation layer 80 may be silicon oxide, silicon oxynitride, silicon nitride, organic materials, or a combination thereof. The material of the planarization layer may be any one of butadiene rubber, polyurethane, polyvinyl chloride, and polyamide, or any one of polycarbonate, polyimide, polyether alum resin, and epoxy resin, which is not limited in the present disclosure.

The difference in thickness h1–h2 of the planar layer 90 due to the auxiliary electrode layer is equal to the thickness of the conductive layer 20. The thickness of the conductive layer 20 is 0.1 μm-0.2 μm. It can be seen that the thickness difference of the planar layer 90 can be reduced by an order of magnitude by the setting of the present disclosure, which can greatly improve the thickness uniformity of the planar layer 90, more effectively reduce the phenomenon of defective etching on the auxiliary electrode layer 70 and ensure the reliability of the display panel.

In addition, a planar layer 90 covering the auxiliary electrode layer 70 and the interlayer dielectric layer 60 may also be formed directly on the side of the interlayer dielectric layer 60 away from the substrate 10. Those skilled in the art may choose according to actual conditions, which will not be limited in the present disclosure.

The present disclosure also provides a display device including the display panel described above. For the beneficial effects of the display device, reference may be made to the foregoing description of the beneficial effects of the display panel, and details are not described herein again. The display device may be a device having a display function, such as a television, a mobile phone, a tablet computer, a notebook computer, a display screen, an advertisement, an electronic watch, or a car display screen, which are not listed here.

It should be noted that although the various steps of the methods of the present disclosure are described in a particular order in the drawings, this does not require or imply that the steps must be performed in that particular order, or that all steps shown must be performed to achieve the expectations the result of. Additionally or alternatively, certain steps may be omitted, multiple steps may be combined into one step for execution, and/or one step may be split into multiple steps for execution, and so on.

Other embodiments of the disclosure will be apparent to those skilled in the art from consideration of the specification and practice of the disclosure disclosed herein. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

What is claimed is:

1. A display panel, comprising:
   a substrate;
   a conductive layer disposed on a side of the substrate;
   a gate insulating layer disposed on a side of the conductive layer away from the substrate;
   a gate layer disposed on a side of the gate insulating layer away from the substrate, wherein the gate layer has a thickness larger than a thickness of the conductive layer;
   a groove extending toward the substrate and punching through the gate layer formed in the gate layer, an orthographic projection of the groove on the substrate overlapping with an orthographic projection of the groove the conductive layer on the substrate, and gate layers separated on two sides of the groove being connected to the conductive layer by respectively penetrating the gate insulating layer;
   an interlayer dielectric layer disposed on a side of the gate layer away from the substrate, the interlayer dielectric layer covering the conductive layer and filling the groove; and
   an auxiliary electrode layer disposed on a side of the interlayer dielectric layer away from the substrate, wherein the orthographic projection of the auxiliary electrode layer on substrate does not overlap with the orthographic projection of the gate layer on the substrate, and the orthographic projection of the auxiliary electrode layer on the substrate overlaps with the orthographic projections of the groove on the substrate.

2. The display panel according to claim 1, wherein the conductive layer is a light-shielding conductive material.

3. The display panel according to claim 1, further comprising:
   a passivation layer disposed on a side of the interlayer dielectric layer away from the substrate and covering the conductive layer;
   a planar layer disposed on a side of the passivation layer away from the substrate; and
   a via hole being disposed on the passivation layer and the planar layer to communicate with the auxiliary electrode layer.

4. The display panel according to claim 1, further comprising:
   a buffer layer disposed between the substrate and the gate insulating layer and covering the conductive layer, wherein the groove penetrates the gate insulating layer and communicates with the buffer layer.

5. The display panel according to claim 1, wherein the conductive layer has a thickness of 0.1 μm to 0.2 μm.

6. A manufacturing method for a display panel, comprising:
   providing a substrate;
   forming a conductive layer on a side of the substrate;
   forming a gate insulating layer on a side of the conductive layer away from the substrate;
   forming a gate layer on a side of the gate insulating layer away from the substrate and making a thickness of the gate layer larger than the thickness of the conductive layer;
   forming a groove extending toward the substrate and punching through the gate layer in the gate layer, wherein an orthographic projection of the groove on the substrate overlaps with an orthographic projection of the conductive layer on the substrate, and gate layers separated on two sides of the groove are connected to the conductive layer by respectively penetrating the gate insulating layer;
   forming an interlayer dielectric layer on a side of the gate layer away from the substrate, the interlayer dielectric layer covering the conductive layer and filling the groove; and
   forming an auxiliary electrode layer on a side of the interlayer dielectric layer away from the substrate, wherein the orthographic projection of the auxiliary electrode layer on substrate does not overlap with the orthographic projection of the gate layer on the substrate, the orthographic projection of the auxiliary electrode layer on the substrate overlaps with the orthographic projections of the groove on the substrate.

7. The manufacturing method according to claim 6, wherein, after the conductive layer is formed on a side of the substrate and before the gate insulating layer is formed on a side of the conductive layer away from the substrate, the manufacturing method further comprises:
   forming a buffer layer covering the conductive layer on a side of the substrate on which the conductive layer is disposed.

8. The manufacturing method according to claim 7, wherein forming the groove extending toward the substrate and punching through the gate layer in the gate layer comprises:
   forming the groove extending toward the substrate and punching through the gate layer on the gate layer; and
   making the groove penetrate the gate insulation layer and communicate with the buffer layer.

9. The manufacturing method according to claim 6, further comprising:
   forming a passivation layer covering the conductive layer on a side of the interlayer dielectric layer away from the substrate;
   forming a planar layer on a side of the passivation layer away from the substrate; and
   forming a via hole communicating with the auxiliary electrode layer on the passivation layer and the planar layer.

10. A display device comprising a display panel, the display panel, comprising:
    a substrate;
    a conductive layer disposed on a side of the substrate;

a gate insulating layer disposed on a side of the conductive layer away from the substrate;

a gate layer disposed on a side of the gate insulating layer away from the substrate, wherein the gate layer has a thickness larger than a thickness of the conductive layer;

a groove extending toward the substrate and punching through the gate layer formed in the gate layer, an orthographic projection of the groove on the substrate overlapping with an orthographic projection of the groove the conductive layer on the substrate, and gate layers separated on two sides of the groove being connected to the conductive layer by respectively penetrating the gate insulating layer;

an interlayer dielectric layer disposed on a side of the gate layer away from the substrate, the interlayer dielectric layer covering the conductive layer and filling the groove; and an auxiliary electrode layer disposed on a side of the interlayer dielectric layer away from the substrate, wherein the orthographic projection of the auxiliary electrode layer on substrate does not overlap with the orthographic projection of the gate layer on the substrate, and the orthographic projection of the auxiliary electrode layer on the substrate overlaps with the orthographic projections of the groove on the substrate.

11. The display device according to claim 10, wherein the conductive layer is a light-shielding conductive material.

12. The display device according to claim 10, further comprising:

a passivation layer disposed on a side of the interlayer dielectric layer away from the substrate and covering the conductive layer;

a planar layer disposed on a side of the passivation layer away from the substrate; and a via hole being disposed on the passivation layer and the planar layer to communicate with the auxiliary electrode layer.

13. The display device according to claim 10, further comprising:

a buffer layer disposed between the substrate and the gate insulating layer and covering the conductive layer, wherein the groove penetrates the gate insulating layer and communicates with the buffer layer.

14. The display device according to claim 10, wherein the conductive layer has a thickness of 0.1 µm to 0.2 µm.

\* \* \* \* \*